United States Patent
Lu

(10) Patent No.: US 9,966,697 B2
(45) Date of Patent: May 8, 2018

(54) ZIPPER TYPE ELECTRICAL CONNECTOR AND CHAIN FOR ZIPPER TYPE ELECTRICAL CONNECTOR

(71) Applicant: BOE Technology Group Co., Ltd., Beijing (CN)

(72) Inventor: Yongjie Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/529,872

(22) PCT Filed: Oct. 10, 2016

(86) PCT No.: PCT/CN2016/101653
§ 371 (c)(1),
(2) Date: May 25, 2017

(87) PCT Pub. No.: WO2017/128766
PCT Pub. Date: Aug. 3, 2017

(65) Prior Publication Data
US 2018/0026394 A1    Jan. 25, 2018

(30) Foreign Application Priority Data

Jan. 27, 2016  (CN) ..................... 2016 2 0081105 U

(51) Int. Cl.
*H01R 13/58* (2006.01)
*H01R 13/629* (2006.01)
*H01R 13/20* (2006.01)

(52) U.S. Cl.
CPC .......... *H01R 13/629* (2013.01); *H01R 13/20* (2013.01)

(58) Field of Classification Search
CPC .... H01R 13/629; H01R 12/58; H01R 12/774; H01R 13/20; H01R 24/60; H01L 25/0655; G02B 6/43
(Continued)

(56) References Cited

U.S. PATENT DOCUMENTS 4,931,021 A    6/1990  Mohan
5,903,059 A *  5/1999  Bertin ................. H01L 21/4853
                                                257/686

(Continued)

FOREIGN PATENT DOCUMENTS

CN         205488583 U    8/2016

OTHER PUBLICATIONS

International Search Report and Written Opinion for International Application No. PCT/CN2016/101653, dated Jan. 16, 2017, 10 pages.

(Continued)

*Primary Examiner* — Jean F Duverne
(74) *Attorney, Agent, or Firm* — Westman, Champlin & Koehler, P.A.

(57) ABSTRACT

The embodiments of the present disclosure relate to a zipper type electrical connector comprising: a first chain and a second chain; a plurality of engaging elements provided on the first and second chains respectively; and a slider slidably connected to the first and second chains, such that the engaging elements on the first and second chains are switched between an engaged state and a disengaged state; wherein, in the engaged state, the engaging elements on the first chain and those on the second chain are arranged close to and staggered with respect to each other, and at least one of the engaging elements on one of the first and second chains and at least one of the engaging elements on the other (Continued)

of the first and second chains are connected to each other one by one to achieve an electrical connection.

16 Claims, 3 Drawing Sheets

(58) Field of Classification Search
USPC .......................................................... 439/452
See application file for complete search history.

(56) References Cited

U.S. PATENT DOCUMENTS

| | | | |
|---|---|---|---|
| 5,938,455 A * | 8/1999 | Glovatsky | H01R 12/58 |
| | | | 439/290 |
| 6,805,568 B2 * | 10/2004 | Kuzmenka | H01R 12/774 |
| | | | 439/285 |
| 7,438,482 B2 * | 10/2008 | Asari | G02B 6/43 |
| | | | 385/89 |
| 9,231,327 B1 | 1/2016 | Liu et al. | |
| 9,601,884 B2 * | 3/2017 | Komoto | H01R 24/60 |
| 9,633,976 B1 * | 4/2017 | Bernstein | H01L 25/0655 |

OTHER PUBLICATIONS

English translation of International Search Report and Box V of the Written Opinion for International Application No. PCT/CN2016/101653, 8 pages.

* cited by examiner

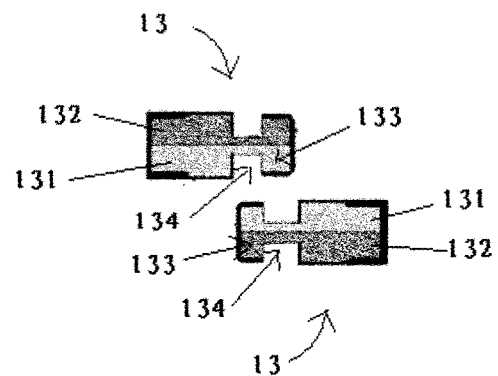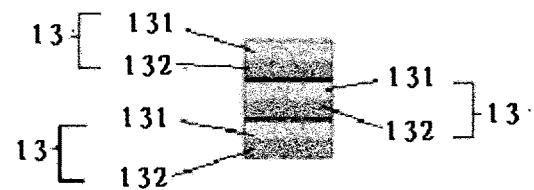
Fig. 3　　　　　　　　Fig. 4
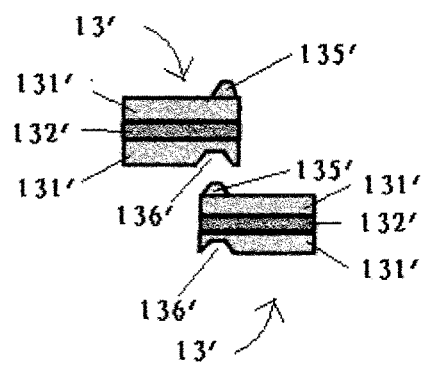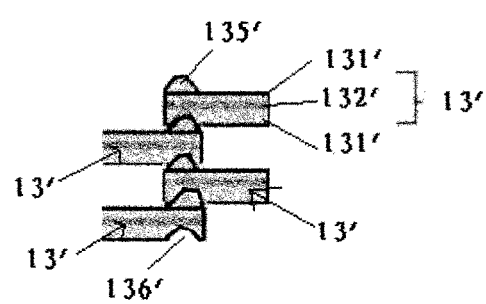
Fig. 5　　　　　　　　Fig. 6

ZIPPER TYPE ELECTRICAL CONNECTOR AND CHAIN FOR ZIPPER TYPE ELECTRICAL CONNECTOR

CROSS-REFERENCE TO RELATED APPLICATION

This application is a Section 371 National Stage Application No. PCT/CN2016/101653, filed on 10 Oct. 2016, which has not yet published, and claims priority to Chinese Patent Application No. 201620081105.9 filed on Jan. 27, 2016 in the State Intellectual Property Office of China, the disclosures of which are incorporated herein by their reference.

BACKGROUND OF THE INVENTION

Field of the Invention

The present invention relates to relates to electrical connectors in electronics industry, and more particularly to a zipper type electrical connector.

Description of the Related Art

In the electronics industry, it is often necessary to use an electronic cable connector (such as cable connectors, flexible cable connectors, FPC connectors, etc.) to achieve a plurality of electrical connections between devices and/or components. At present, the electronic cable connection is generally implemented by using a terminal plug, welding, etc., in particular, a FPC cable connection is very cumbersome.

SUMMARY OF THE INVENTION

It is at least one object of the present invention to provide a zipper type electrical connector which can be operated easily and connected stably and reliably.

It is a further object of the present invention to provide a zipper type electrical connector which facilitates disassembly and/or maintenance.

Accordingly, the present disclosure provides a zipper type electrical connector comprising:

a first chain and a second chain;

a plurality of engaging elements provided on the first and second chains respectively; and a slider slidably connected to the first and second chains, such that the engaging elements on the first and second chains are switched between an engaged state and a disengaged state;

wherein, in the engaged state, the engaging elements are configured such that the engaging elements on the first chain and those on the second chain are arranged close to and staggered with respect to each other, and at least one of the engaging elements on one of the first and second chains and at least one of the engaging elements on the other of the first and second chains are connected to each other one by one to achieve an electrical connection; in the disengaged state, the engaging elements on the first chain is disengaged and electrically insulated from those on the second chain.

In an embodiment, each of engaging elements comprises at least an electrical connection portion and an electrical insulation portion, wherein in the engaged state, the electrical connection portions of at least one engaging element of one of the first and second chains are connected to the electrical connection portions of at least one engaging element of the other of the first and second chains to achieve an electrical connection, and the electrical insulation portion of each of engaging elements electrically isolates two adjacent engaging elements on one same chain.

In an embodiment, each of the engaging elements comprises one electrical connection portion and one electrical insulation portion, the electrical connection portion and the electrical insulation portion of each engaging element on one same chain being arranged alternately, an engaging tooth and an engaging groove being formed on each of the electrical connection portion and the electrical insulation portion, and wherein, in the engaging state, the engaging tooth of each engaging element of one of the first and second chains is engaged into the engaging groove of each engaging element of the other of the first and second chains.

In an embodiment, each of engaging elements comprises a first electrical connection portion, a second electrical connection portion, and an electrical insulation portion arranged between the first and second electrical connection portions and electrically insulating the first and second electrical connection portions from each other, the first electrical connection portion, the electrical insulation portion, and the second electrical connection portion of each engaging element of the same chain are sequentially arranged in an order of the first electrical connection portion, the electrical insulation portion and the second electrical connection portion, an engaging tooth is formed on the first electrical connection portion, and an engaging groove is formed on the second electrical connection portion; and wherein, in the engaged state, the engaging tooth of each engaging element of one of the first and second chains is engaged into the engaging groove of each engaging element of the other of the first and second chains.

In an embodiment, the electrical connection portion and the electrical insulation portion are in a form of a thin layer.

In an embodiment, in each engaging element, the electrical connection portion comprises a metal material, and the electrical insulation portion comprises an insulating material.

In an embodiment, the metal material comprises metallic copper, and the insulating material comprises plastic.

In an embodiment, the slider is electrically insulated.

In an embodiment, the zipper type electrical connector is a cable connector, a soft cable connector, or a flexible circuit board connector.

The present disclosure also provides a chain for a zipper type electrical connector, comprising a plurality of engaging elements configured to be mated with a plurality of engaging elements of other chain so as to be switched between an engaged state and an disengaged state, wherein a plurality of engaging elements of the chain are configured to be arranged close to and stagger with a plurality of engaging elements of the other chain in the engaging state with another chain to achieve an electrical conduction, and to be disengaged from the plurality of engaging elements of the other chain in the disengaged state to achieve an electrical insulation.

In an embodiment, the chain further comprises a slider slidably disposed on the chain, and the slider is configured such that, the engaging elements of the chain and those of the other chain are switched between the engaged state and the disengaged state by sliding the slider.

In an embodiment, each of the plurality of engaging elements comprises at least an electrical connection portion and an electrical insulation portion, wherein, in the engaged state, the electrical connection portions of at least one engaging element of one chain are connected to the electrical connection portions of at least one engaging element of the other chain one by one to achieve an electrical connection, and the electrical insulation portion of each engaging element electrically isolates two adjacent engaging elements on one same chain.

In an embodiment, each of the engaging elements comprises one electrical connection portion and one electrical insulation portion, the electrical connection portion and the electrical insulation portion of each engaging element on the chain being arranged alternately, an engaging tooth and an engaging groove being formed on each of the electrical connection portion and the electrical insulation portion, and wherein, in the engaging state, the engaging tooth of each engaging element of the chain is engaged into the engaging groove of each engaging element of the other chain.

In an embodiment, each of engaging elements comprises a first electrical connection portion, a second electrical connection portion, and an electrical insulation portion arranged between the first and second electrical connection portions and electrically insulating the first and second electrical connection portions from each other, the first electrical connection portion, the electrical insulation portion, and the second electrical connection portion of each engaging element of the same chain are sequentially arranged in an order of the first electrical connection portion, the electrical insulation portion and the second electrical connection portion, an engaging tooth is formed on the first electrical connection portion, and an engaging groove is formed on the second electrical connection portion; and wherein, in the engaged state, the engaging tooth of each engaging element of the chain is engaged into the engaging groove of each engaging element of the other chain.

In an embodiment, the electrical connection portion and the electrical insulation portion are in a form of a thin layer.

In an embodiment, in each engaging element, the electrical connection portion comprises a metal material, and the electrical insulation portion comprises an insulating material.

In an embodiment, the metal material comprises metallic copper, and the insulating material comprises plastic.

In an embodiment, the slider is electrically insulated.

The present disclosure further provides an electrical device comprising the chain according to any one of the above embodiments.

The present disclosure further discloses an electrical device comprising a display panel, a circuit board, and a zipper type electrical connector according to any one of above embodiments, wherein the first chain of the zipper type electrical connector is provided on the display panel and a second chain of the zipper type electrical connector is provided on the circuit board, the display panel and the circuit board being electrically connected through the first and second chains.

Other inventive objects that can be achieved by the present invention and other technical effects that may be attained will be set forth in the following detailed description of the description of the specific embodiments and the accompanying drawings.

BRIEF DESCRIPTION OF THE DRAWINGS

The above and other features of the present invention will become more apparent by describing in detail exemplary embodiments thereof with reference to the accompanying drawings, in which:

FIGS. 3 and 4 are schematic views of an structure of a first embodiment of an engaging element of a zipper type electrical connector shown in FIG. 2, wherein FIG. 3 shows a state in which a pair of engaging elements are disengaged from each other and FIG. 4 shows a state in which several engaging elements are engaged;

FIGS. 5 and 6 are schematic views of an structure of a second embodiment of the engaging elements in the zipper type electrical connector shown in FIG. 2, wherein FIG. 5 shows a state in which a pair of engaging elements are disengaged from each other and FIG. 6 shows a state in which several engaging elements are engaged;

DETAILED DESCRIPTION OF PREFERRED EMBODIMENTS OF THE INVENTION

Figure 1:
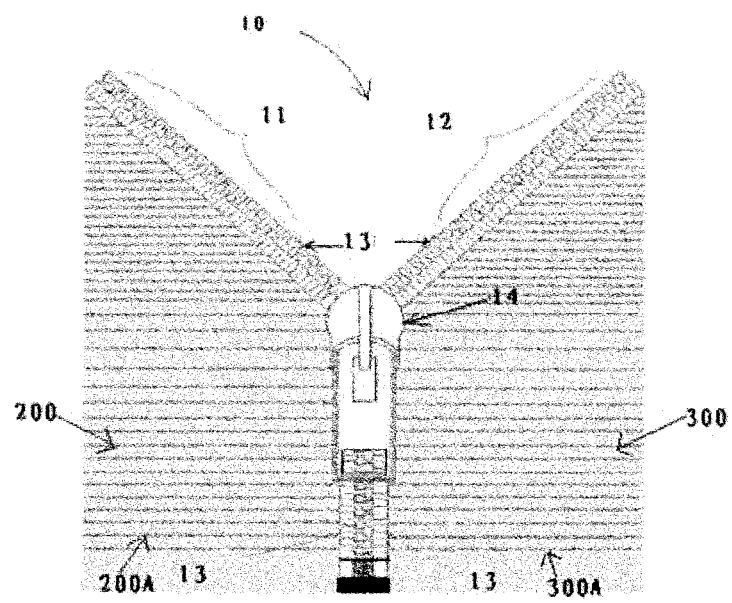
FIG. 1 is a schematic structural view of a zipper type electrical connector according to a specific embodiment of the invention applied between a pair of electronic cables.

Hereinafter, specific embodiments of the present invention will be described in detail, examples of which are shown in the accompanying drawings, wherein like reference numerals refer to like or similar elements throughout the context. The specific embodiments described below with reference to the accompanying drawings are exemplary and are intended to be illustrative of the invention and are not to be construed as limiting thereto.

According to a general concept of the present disclosure, there is provided a zipper type electrical connector comprising: a first chain and a second chain; a plurality of engaging elements provided on the first and second chains respectively; and a slider slidably connected to the first and second chains, such that the engaging elements on the first and second chains are switched between an engaged state and a disengaged state; wherein, in the engaged state, the engaging elements on the first chain and those on the second chain are arranged close to and staggered with respect to each other, and at least one of the engaging elements on one of the first and second chains and at least one of the engaging elements on the other of the first and second chains are connected to each other one by one to achieve an electrical connection; in the disengaged state, the engaging elements on the first chain is disengaged and electrically insulated from those on the second chain.

The present invention achieves at least the following technical effects:

The present disclosure provides a zipper type electrical connector which adopts the zipper to realize a design concept of the electrical connection between the corresponding engaging elements of two chains. It facilitates connection between electronic cables (such as cables, flexible cables, FPC cables, etc.) in a way of a simple, convenient, secured and reliable zipper type connection, thus providing a more convenient and efficient electrical connection manner. In particular, in the aspect of electrical testing and maintenance, the zipper type electrical connector provided by the present disclosure not only facilitates the replacement of a test object during the test, but also facilitates saving material during maintenance.

Referring FIGS. 1-6, below, a zipper type electrical connector according to a specific embodiment of the present invention is described taking a flexible circuit board (FPC) connector as an example. A zipper type electrical connector 10 comprising: a first chain 11 and a second chain 12; a plurality of engaging elements 13 provided on the first and second chains 11, 12 respectively; and a slider 14 slidably connected to the first and second chains 11, 12. The engaging elements 13 on the first chain 11 and the engaging elements 13 on the second chain 12 are arranged close to and staggered with respect to each other, and each of the engaging elements 13 includes at least an electrical connection portion and an electrical insulation portion. The slider 14 is slidably connected to the first and second chains 11, 12, such that the engaging elements 13 on the first and second chains 11, 12 are switched between an engaged state and a disengaged state. In the engaged state, the electrical connection portion of the engaging element 13 of one of the first and second chains 11, 12 are connected to the electrical connection portion of the corresponding engaging element 13 of the other of the first and second chains 11, 12 one by one to achieve an electrical connection, and the electrical insulation portion of each of engaging elements 13 electrically isolates two adjacent engaging elements on one same chain.

The zipper type electrical connector provided by the present disclosure realizes a mechanical connection between the corresponding engaging elements on the two chains (e.g., the first chain 11 and the second chain 12) by way of a zipper, so that the electrical connection portions of the corresponding engaging elements on the different chains are connected to each other one by one to achieve an electrical connection, while the adjacent engaging elements on the same chain (e.g., the first chain 11 or the second chain 12) are electrically insulated to each other by the electrical insulation portion. Therefore, as shown in FIG. 1, the aforementioned zipper type electrical connector 10 can be applied to the mechanical and electrical connection between the first flexible circuit board 200 and the second flexible circuit board 300, wherein, through the zipper type electrical connector 10, the electric wires 200A in the first flexible circuit board 200 are electrically connected with the corresponding electrical wires 300A in the second flexible circuit board 300, respectively, to achieve an electrical connection between the first and second flexible circuit boards 200, 300.

In order to achieve an electrical connection between the electrical connection portions of the corresponding engaging elements of the different chains one by one, and achieve an electrical insulation between the adjacent engaging elements on the same chain by the electrically insulting portion, in the zipper type electrical connector provided by the present disclosure, the engaging elements 13 may be of different construction designs.

Figure 2:
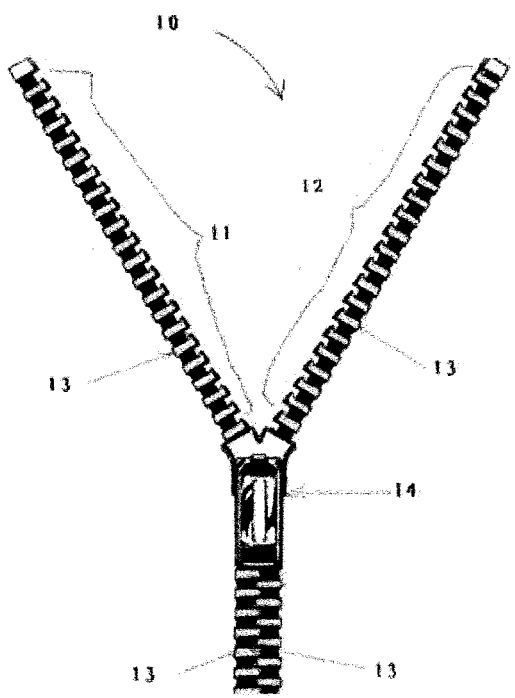
FIG. 2 is a schematic structural view of a zipper type electrical connector according to a specific embodiment of the present invention.

FIGS. 3 and 4 are schematic views of an enlarged structure of a first embodiment of an engaging element of a zipper type electrical connector shown in FIG. 2, respectively, wherein FIG. 3 shows a state in which a pair of engaging elements are disengaged from each other and FIG. 4 shows a state in which several engaging elements are engaged.

As shown in FIGS. 3 and 4, each of the engaging elements 13 comprises one electrical connection portion 131 and one electrical insulation portion 132. The electrical connection portion 131 and the electrical insulation portion 132 of each engaging element on one same chain are arranged alternately. Specifically, except for the first and final engaging elements on the same chain, each engaging element 13 includes an electrical connection portion 131 facing an adjacent engaging element 13 of the same chain and an electrical insulation portion 132 facing another adjacent engaging element 13 on the same chain. Further, in each of the engaging members 13, an engaging tooth 133 and an engaging groove 134 are formed on each of the electrical connection portion 131 and the electrical insulation portion 132. As shown in FIG. 4, in the engaging state in which the corresponding engaging elements 13 on two chains are engaged with each other, the engaging tooth 133 of the electrical connection portion 131 of each engaging element 13 of one chain is engaged into the engaging groove 134 of the electrical connection portion 131 of each engaging element 13 of the other chain, so as to achieve an electrical connection between the corresponding engaging elements 13 on two chains. Further, the engaging tooth 133 of the electrical insulation portion 132 of each engaging element 13 of one chain is engaged into the engaging groove 134 of the electrical insulation portion 132 of each engaging element 13 of the other chain so as to achieve an electrical insulation between two engaging elements on the same chain. In the state in which the two chains are separated from each other, the corresponding engaging elements 13 in two chains are separated from each other without any connection and contact therebetween, thereby achieving an electrical insulation.

FIGS. 5 and 6 are schematic views of an enlarged structure of a second embodiment of the engaging elements in the zipper type electrical connector shown in FIG. 2, respectively, wherein FIG. 5 shows a state in which a pair of engaging elements are disengaged from each other and FIG. 6 shows a state in which several engaging elements are engaged.

As shown in FIGS. 5 and 6, each of engaging elements 13' comprises a first electrical connection portion 131', a second electrical connection portion 131', and an electrical insulation portion 132' arranged between the first and second electrical connection portions and electrically insulating therebetween. The first electrical connection portion, the electrical insulation portion, and the second electrical connection portion of each engaging element of the same chain are sequentially arranged in an order of the first electrical connection portion, the electrical insulation portion and the second electrical connection portion. Specifically, except for the first and final engaging elements on the same chain, each engaging element 13' includes a first electrical connection portion 131' facing an adjacent engaging element 13' of the same chain, a second electrical connection portion 131' facing another adjacent engaging element of the same chain, and an electrical insulation portion 132' arranged between the first and second electrical connection portions and electrically insulating therebetween. Further, an engaging tooth 135' is formed on the first electrical connection portion 131', and an engaging groove 136' is formed on the second electrical connection portion 131'. In the engaged state, as shown in FIG. 6, the engaging tooth 135' of each engaging element 13' of one of the first and second chains is engaged into the engaging groove 136' of the corresponding engaging element 13' of the other of the first and second chains so as to achieve an electrical connection between the corresponding engaging elements 13' of two chains. Further, as shown in FIG. 6, since the electrical insulation portion 132' which electrically insulates the first and second electrical connection portion 131' from each other is arranged therebetween, an electrical insulation is ensured between two adjacent engaging elements of the same chain. In a state in which two chains are separated from each other, the corresponding engaging elements 13' of the two chains are disengaged from each other, without any connection or touch therebetween, so as to achieve an electrical insulation.

According to an embodiment of the present disclosure, as shown in FIGS. 3 and 5, in each engaging element 13 of the zipper type electrical connector, the electrical connection portion 131, 131' and the electrical insulation portion 132, 132' are optionally in a form of a thin layer. According to practical requirement, the electrical connection portion and the electrical insulation portion may be made of thin layers with different thicknesses or with an identical thickness. Further, also according to practical requirement, density of the engaging elements may be adjusted by changing the number of the engaging elements in the chain and thickness of each individual engaging element.

According to a specific embodiment of the present disclosure, as shown in FIGS. 3 and 5, in each engaging element 13, the electrical connection portions 131, 131' are made of metal material to achieve an electrical connection, while the electrical insulation portions 132, 132' are made of an insulating material so as to achieve an electrical insulation. For example, the metal material optionally comprises metallic copper, and the insulating material optionally comprises plastic.

According to a specific embodiment of the present disclosure, as shown in FIGS. 1 and 2, in the zipper type electrical connector 10, the slider 14 is slidably connected to the first and second chains 11, 12, such that the engaging elements 13 on the first and second chains 11, 12 are switched between an engaged state and a disengaged state. Therefore, the slider 14 may be electrically insulated, and may be made of plastic for example. Further, the size of the slider 14 is adapted to that of the chain and engaging elements. Further, according to actual situation, the size of the slider 14 may be set as small as possible. Further, to ensure stability of the connection, the slider 14 should be configured to be secured at an end of the chain.

Further, it is to be noted that, in the zipper type electrical connector provided by the present invention, the chain on which the engaging elements are provided should be made of an insulating material, for example, insulating cloth or plastic.

Although a zipper type electrical connector according to a specific embodiment of the present invention has been described with reference to a flexible circuit board connector as an example, it will be understood by those skilled in the art that the zipper type electrical connector may also be a cable connector, a flexible cable connector, or any other suitable connector. For example, the previously described zipper type electrical connector may be an FPC cable suitable usable between an electrical element CELL and a printed circuit board assembly PCBA so to facilitate testing and maintenance, especially facilitate changing an electrical elements or a printed circuit board assembly in testing. In addition, material can also be saved in the after-sales maintenance phase.

Further, according some embodiments of the present invention, there is provided a chain comprising a plurality of engaging elements. The chain is adapted to be mated with another chain with a plurality of engaging elements, so as to be switched between an engaged state and a disengaged state. Specifically, in the engaged state, the plurality of engaging elements of the chain are configured to be arranged close to and stagger with a plurality of corresponding engaging elements of the other chain to achieve an electrical conduction, and to be disengaged from the plurality of engaging elements of the other chain in the disengaged state, without any connection or touch therebetween so as to achieve an electrical insulation.

More specifically, each of the plurality of engaging elements comprises an electrically connection portion and an electrical insulation portion. In the engaged state, the electrical connection portions of an engaging element of one chain are connected, one by one, to the electrical connection portions of a corresponding engaging element of the other chain to achieve an electrical connection, and the electrical insulation portion of each engaging element electrically isolates two adjacent engaging elements on one same chain.

More specifically, one of the chain and the other chain further comprises a slider slidably disposed thereon. The engaging elements of the chain and those of the other chain are switched between the engaged state and the disengaged state by sliding the slider.

It should be appreciated by those skilled in the art that, the chain corresponds to one of the first and second chains 11, 12. Therefore, in these embodiments, the chain may have same features as those in the above mentioned first and second chains 11, 12. To avoid duplication, these technical features are not repeated here.

Figure 7:
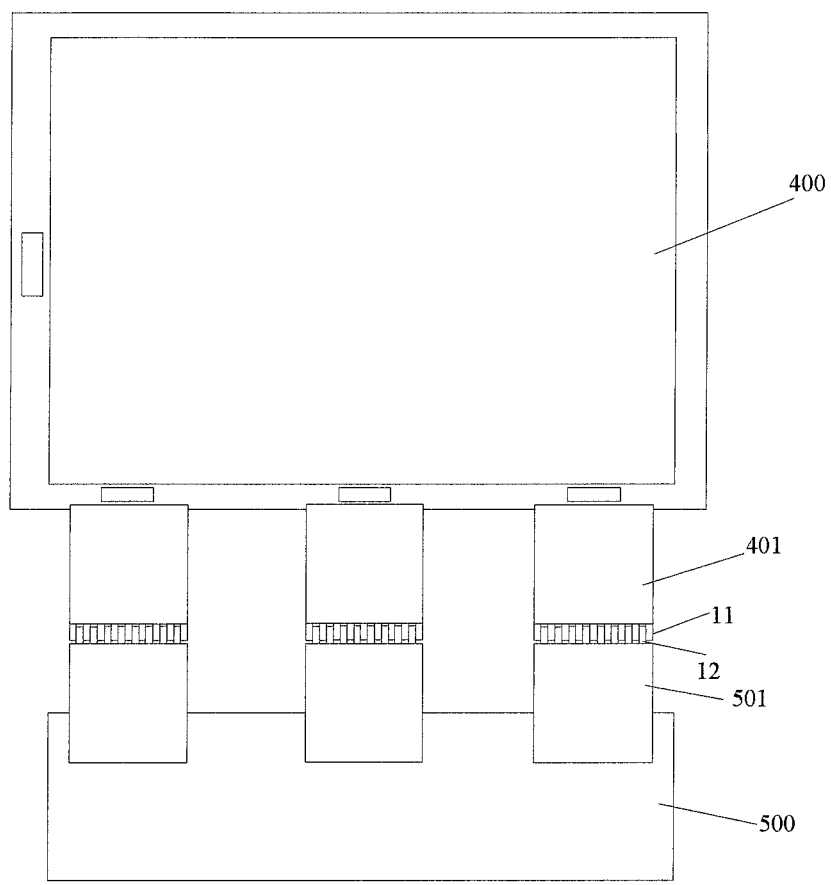
FIG. 7 is a schematic structural view of an electrical device comprising a chain or a zipper type electrical connector according to an embodiment of the present invention.

In this regard, according to some embodiment of the present disclosure, the present disclosure further provides an electrical device. As shown in FIG. 7, the chain 11 may be arranged on the electrical device 400, e.g., a display panel. Correspondingly, the other chain to be mated with it may be arranged on a flexible circuit board so as to achieve an electrical connection between the display panel and the flexible circuit board 401. In another example, the chain may be arranged in a flexible circuit board (FPC) 401. Correspondingly, the other chain 12 to be mated therewith may be arranged on another flexible circuit board 501 so as to achieve an electrical connection between two flexible circuit boards, by the cooperation of two chains. As such, it facilitates testing and maintenance, especially facilitates changing a printed circuit board assembly 500. In addition, material can also be saved in the after-sales maintenance phase.

The zipper type electrical connector provided by the present disclosure adopts the zipper to realize a design concept of the electrical connection between the corresponding engaging elements of two chains. It facilitates connection between electronic cables (such as cables, flexible cables, FPC cables, etc.) in a way of a simple, convenient and reliable zipper type connection, thus providing a more convenient and efficient electrical connection manner. In particular, in the aspect of electrical testing and maintenance, the zipper type electrical connector provided by the present disclosure not only facilitates the replacement of the test object during the test, but also facilitates saving material during maintenance.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A zipper type electrical connector comprising:
   a first chain and a second chain;
   a plurality of engaging elements provided on the first and second chains respectively; and
   a slider slidably connected to the first and second chains, such that the engaging elements on the first and second chains are switched between an engaged state and a disengaged state;

wherein, in the engaged state, the engaging elements on the first chain and those on the second chain are arranged close to and staggered with respect to each other, and at least one of the engaging elements on one of the first and second chains and at least one of the engaging elements on the other of the first and second chains are interconnected one by one achieve an electrical connection; and in the disengaged state, the engaging elements on the first chain is disengaged and electrically insulated from those on the second chain, and wherein, each of engaging elements comprises at least an electrical connection portion and an electrical insulation portion, wherein in the engaged state, the electrical connection portions of at least one engaging element of one of the first and second chains are connected to the electrical connection portions of at least one engaging element of the other of the first and second chains to achieve an electrical connection, and the electrical insulation portion of each of engaging elements electrically isolates two adjacent engaging elements on one same chain, and wherein, each of the engaging elements comprises one electrical connection portion and one electrical insulation portion, the electrical connection portion and the electrical insulation portion of each engaging element on one same chain being arranged alternately, an engaging tooth and an engaging groove being formed on each of the electrical connection portion and the electrical insulation portion, and wherein in the engaging state, the engaging tooth of each engaging element of one of the first and second chains is engaged into the engaging groove of each engaging element of the other of the first and second chains.

2. The zipper type electrical connector according to claim 1, wherein, each of engaging elements comprises a first electrical connection portion, a second electrical connection portion, and an electrical insulation portion arranged between the first and second electrical connection portions and electrically insulating the first and second electrical connection portions from each other, the first electrical connection portion, the electrical insulation portion, and the second electrical connection portion of each engaging element of the same chain being sequentially arranged in an order of the first electrical connection portion, the electrical insulation portion and the second electrical connection portion, an engaging tooth is formed on the first electrical connection portion, and an engaging groove is formed on the second electrical connection portion; and wherein, in the engaged state, the engaging tooth of each engaging element of one of the first and second chains is engaged into the engaging groove of each engaging element of the other of the first and second chains.

3. The zipper type electrical connector according to claim 1, wherein, the electrical connection portion and the electrical insulation portion are in a form of a thin layer.

4. The zipper type electrical connector according to claim 1, wherein, in each engaging element, the electrical connection portion comprises a metal material, and the electrical insulation portion comprises an insulating material.

5. The zipper type electrical connector according to claim 4, wherein, the metal material comprises metallic copper, and the insulating material comprises plastic.

6. The zipper type electrical connector according to claim 1, wherein, the slider is electrically insulated.

7. The zipper type electrical connector according to claim 1, wherein, the zipper type electrical connector is a cable connector, a soft cable connector, or a flexible circuit board connector.

8. A electrical device comprising a display panel, a circuit board, and a zipper type electrical connector according to claim 1, wherein the first chain of the zipper type electrical connector is provided on the display panel and a second chain of the zipper type electrical connector is provided on the circuit board, the display panel and the circuit board being electrically connected through the first and second chains.

9. A chain for a zipper type electrical connector, comprising a plurality of engaging elements configured to be mated with a plurality of engaging elements of another chain so as to be switched between an engaged state and an disengaged state, wherein a plurality of engaging elements of the chain are configured to be arranged close to and stagger with a plurality of engaging elements of the other chain in the engaging state with another chain to achieve an electrical conduction, and to be disengaged from the plurality of engaging elements of the other chain in the disengaged state to achieve an electrical insulation, and each of the plurality of engaging elements comprises at least an electrical connection portion and an electrical insulation portion, wherein, in the engaged state, the electrical connection portions of at least one engaging element of one chain are connected to the electrical connection portions of at least one engaging element of the other chain one by one to achieve an electrical connection, and the electrical insulation portion of each engaging element electrically isolates two adjacent engaging elements on one same chain, each of the engaging elements comprises one electrical connection portion and one electrical insulation portion, the electrical connection portion and the electrical insulation portion of each engaging element on the chain being arranged alternately, an engaging tooth and an engaging groove being formed on each of the electrical connection portion and the electrical insulation portion, and wherein, in the engaging state, the engaging tooth of each engaging element of the chain is engaged into the engaging groove of each engaging element of the other chain.

10. The chain according to claim 9, wherein the chain further comprises a slider slidably disposed on the chain, and the slider is configured such that, the engaging elements of the chain and those of the other chain are switched between the engaged state and the disengaged state by sliding the slider.

11. The chain according to claim 9, wherein, each of engaging elements comprises a first electrical connection portion, a second electrical connection portion, and an electrical insulation portion arranged between the first and second electrical connection portions and electrically insulating the first and second electrical connection portions from each other, the first electrical connection portion, the electrical insulation portion, and the second electrical connection portion of each engaging element of the same chain being sequentially arranged in an order of the first electrical connection portion; the electrical insulation portion and the second electrical connection portion, an engaging tooth is formed on the first electrical connection portion, and an engaging groove is formed on the second electrical connection portion; and wherein, in the engaged state, the engaging tooth of each engaging element of the chain is engaged into the engaging groove of each engaging element of the other chain.

12. The chain according to claim 9, wherein,
the electrical connection portion and the electrical insulation portion are in a form of a thin layer.

13. The chain according to claim 9, wherein,
in each engaging element, the electrical connection portion comprises a metal material, and the electrical insulation portion comprises an insulating material.

14. The chain according claim 13, wherein,
the metal material comprises metallic copper, and the insulating material comprises plastic.

15. The chain according claim 10, wherein,
the slider is electrically insulated.

16. A electrical device comprising the chain according to claim 9.

\* \* \* \* \*